(12) United States Patent
Shiraiwa et al.

(10) Patent No.: US 7,303,964 B2
(45) Date of Patent: Dec. 4, 2007

(54) SELF-ALIGNED STI SONOS

(75) Inventors: Hidehiko Shiraiwa, San Jose, CA (US); Mark Randolph, San Jose, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 325 days.

(21) Appl. No.: 11/113,509

(22) Filed: Apr. 25, 2005

(65) Prior Publication Data

US 2006/0240635 A1    Oct. 26, 2006

(51) Int. Cl.
*H01L 21/336* (2006.01)
(52) U.S. Cl. ............... 438/294; 438/424; 257/E21.545
(58) Field of Classification Search ............... 438/424, 438/296, 294; 257/E21.545
See application file for complete search history.

(56) References Cited

U.S. PATENT DOCUMENTS

| | | | |
|---|---|---|---|
| 5,851,881 A * | 12/1998 | Lin et al. ............... | 438/261 |
| 6,013,551 A * | 1/2000 | Chen et al. ............... | 438/264 |
| 6,621,113 B2 | 9/2003 | Lee | |
| 2002/0033501 A1 | 3/2002 | Sakagami | |
| 2002/0149081 A1 | 10/2002 | Goda et al. | |
| 2002/0149958 A1 | 10/2002 | Kunikiyo | |
| 2004/0026748 A1 | 2/2004 | Goda et al. | |
| 2004/0048433 A1 | 3/2004 | Takahashi | |

OTHER PUBLICATIONS

International Search Report, Int'l Application No. PCT/US2006/015759, Int'l Filing Date Apr. 24, 2006, 3 pgs.

* cited by examiner

*Primary Examiner*—Bradley K. Smith
(74) *Attorney, Agent, or Firm*—Eschweiler & Associates, LLC

(57) ABSTRACT

Methods 300 and 350 are disclosed for fabricating shallow isolation trenches and structures in multi-bit SONOS flash memory devices. One method aspect 300 comprises forming 310 a multi-layer dielectric-charge trapping-dielectric stack 420 over a substrate 408 of the wafer 402, for example, an ONO stack 420, removing 312 the multi-layer dielectric-charge trapping-dielectric stack 420 in a periphery region 406 of the wafer 402, thereby defining a multi-layer dielectric-charge trapping-dielectric stack 420 in a core region 404 of the wafer 402. The method 300 further comprises forming 314 a gate dielectric layer 426 over the periphery region 406 of the substrate 408, forming 316 a first polysilicon layer 428 over the multi-layer dielectric-charge trapping-dielectric stack 420 in the core region 402 and the gate dielectric 426 in the periphery region 406 , then concurrently forming 318 an isolation trench 438 in the substrate 408 in the core region 404 and in the periphery region 406. Thereafter, the isolation trenches are filled 326 with a dielectric material 446, and a second polysilicon layer 452 that is formed 332 over the first polysilicon layer 428 and the filled trenches 438, forming an self-aligned STI structure 446. The method 300 avoids ONO residual stringers at STI edges in the periphery region, reduces active region losses, reduces thinning of the periphery gate oxide and the ONO at the STI edge, and reduces dopant diffusion during isolation implantations due to reduced thermal process steps.

21 Claims, 14 Drawing Sheets

SELF-ALIGNED STI SONOS

FIELD OF INVENTION

The present invention relates generally to semiconductor device processing and more particularly to a method and system for fabricating flash memory cells in a semiconductor device.

BACKGROUND OF THE INVENTION

Flash and other types of electronic memory devices are constructed of memory cells operative to individually store and provide access to binary information or data. The memory cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry using wordlines and bitlines. Conventional flash memories are constructed in a cell structure wherein one or more bits of information or data are stored in each flash memory cell. In typical single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well.

The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

Other types of memory devices include ones comprising silicon or polysilicon above and below an ONO layer, these silicon-oxide-nitride-oxide-silicon devices are sometimes referred to as SONOS memory devices. Such devices may include physical dual bit memory cells, individually adapted to store two binary bits of data by localized charge trapping. The SONOS memory devices provide data retention with a thin bottom oxide, low-voltage operation, and fast programming speed.

Dual bit memory cells are generally symmetrical, including two identical and interchangeable source/drain regions. Application of appropriate voltages to the gate, drain, and source terminals allows access to one of the two bits (e.g., for read, program, erase, verify, or other operations). Core cells in flash memory devices, whether single bit or multiple-bit, may be interconnected in a variety of different configurations. For instance, cells may be configured in a virtual ground type configuration, with the control gates of the cells in a row individually connected to a wordline. In addition, the source/drain regions of memory cells in a particular column are connected together by a conductive bitline. In operation, individual flash cells and the individual data bits thereof, are addressed via the respective bitlines connected to first and second source/drain regions thereof and a wordline connected to the gate using peripheral decoder and control circuitry for programming (writing), reading, erasing, or other functions.

In most such array configurations the active regions of the individual flash cells are electrically isolated from one another by an isolation structure comprising an insulative material. This isolation structure may be formed similar to that of conventional shallow trench isolation (STI) fabrication methods before the formation of the ONO layers and the polysilicon gate layer.

As device densities increase and product dimensions decrease, it is desirable to reduce the size of the various structures and features associated with individual memory cells, sometimes referred to as scaling. However, the fabrication techniques used to produce conventional dual-bit SONOS flash memory cells limit or inhibit the designer's ability to reduce cell dimensions. In a conventional manufacturing process whereby an STI isolation structure may be formed in a SONOS flash memory device, the STI is initially formed and filled, and an ONO layer is formed overlying the STI and a substrate. An anisotropic etch is then used to remove the ONO in a periphery region, leaving the ONO in the core region of the device. Thereafter, a polysilicon gate layer is selectively formed over the wafer, and other typical lithographic processes continue as usual.

However, because the anisotropic etch is selective to horizontal surfaces, ONO residual stringers may detrimentally remain on lateral edges of STI regions in periphery regions of the die. In order to scale the memory cell devices to facilitate increased device densities, it is desirable to provide the widest possible active region between STI isolation structures while maintaining minimal isolation dopant diffusion therebetween. However, limitations in the number of oxidation, thermal, and cleaning processes used to form such isolation structures, typically produce excessive oxidation, dopant diffusion, and STI oxide thinning areas that effectively limit the ability to scale the device within desired performance specifications. Thus, there is a need for improved manufacturing techniques by which multi-bit SONOS flash memory devices may be scaled without sacrificing device performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

The invention provides methods for fabricating multi-bit SONOS and other flash memory cells, involving the formation of improved self-aligned STI structures (SASTI) used to isolate active core regions as well as periphery regions of the memory array. The methods of the present invention provide for the concurrent fabrication of the SASTI structures in both the core regions and in the periphery regions of a memory device, for example, as may be useful in NAND type memory architectures.

One method provides for the fabrication of a multi-layer dielectric-charge trapping-dielectric stack (e.g., ONO stack) formed over a substrate of a wafer. The stack is then removed in the periphery region of the wafer to define the stack in the core region of the wafer. A gate dielectric layer (e.g., $SiO_2$) is then formed (e.g., grown via thermal oxidation) over the periphery region of the substrate. A first polysilicon layer (poly1) is then formed for use as a polysilicon gate structure over the multi-layer dielectric-charge trapping-dielectric stack (e.g., ONO) in the core region and over the gate dielectric layer in the periphery region. An opening or STI isolation trench is then concurrently formed in the substrate, through the Poly1 layer and the stack in the core region and through the Poly1 layer and the gate dielectric layer in the periphery region, thereby defining isolation trenches in both regions of the wafer.

After forming the SASTI trenches, and before the trenches are filled, they may be implanted with a dopant ion species (e.g., B, $BF_2$, or a p-type dopant) thru the trench openings and into the substrate to improve or otherwise modify the Vt and other such device characteristics. Thereafter, the trenches are filled (e.g., via an oxidation or deposition process) with a dielectric (e.g., $SiO_2$) material. After filling the trenches with the dielectric material, the wafer may then be planarized (e.g., using a CMP process) to separate individual isolation structures. A subsequent second polysilicon layer (Poly2) or another such conductive material layer is then formed over the Poly1 layer and the filled trenches, for example, to define conductive wordline structures, or to interconnect polysilicon gates to corresponding wordlines.

In one aspect of the present invention, the multi-layer dielectric-charge trapping-dielectric stack overlying the substrate comprises a first oxide layer overlying the substrate of the wafer, a nitride layer overlying the first oxide layer, and a second oxide layer overlying the nitride layer, or another such multi-layer ONO type stack.

In another aspect of the present invention, the SASTI trenches need only be formed in the periphery region of the memory device, for example, as may be useful in multi-bit type memory architectures that do not require the use of SASTI or STI structures in the core region.

In yet another aspect of the present invention, the SASTI trenches need only be formed in the core region of the memory device, for example, for another type device architecture that may not require the use of isolation structures in the periphery region, or for other future fabrication purposes.

The invention thus facilitates the manufacture of scaled memory devices requiring fewer existing processing steps than that of a conventional method. Beneficially, the fabrication method of the present invention avoids ONO residual stringers, which are particularly difficult to remove conventionally when the ONO comprises alumina, because of the ordering of the process steps, and the method avoids oxide thinning at the edge of STIs because a detrimental cleaning process is avoided. Further, the fabrication method of the present invention mitigates active region loss for bitlines and other such structures because fewer oxidation and thermal processes are required. In addition, the fabrication method of the present invention provides better STI isolation because the dopant of the SASTI isolation implant diffuses less and is more easily controlled.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
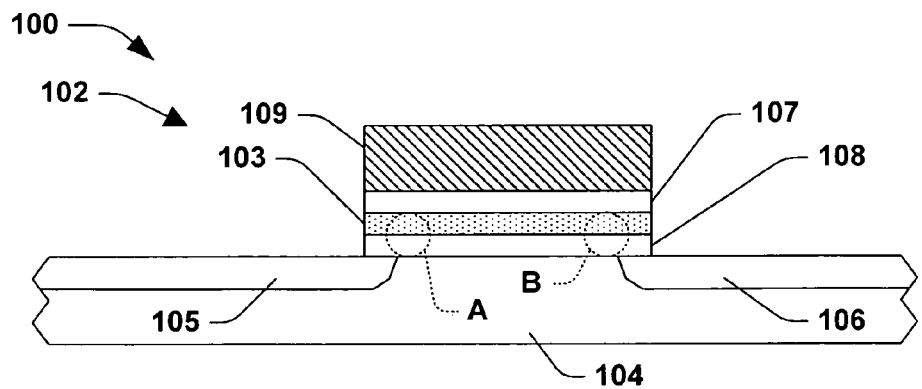
FIG. 1A is a partial side elevation view in section illustrating an exemplary dual bit flash memory cell which may be fabricated in accordance with one or more aspects of the invention.

One or more implementations of the present invention will now be described with reference to the drawings, wherein like reference numerals are used to refer to like elements throughout, and wherein the various structures are not necessarily drawn to scale. The present invention relates to a system and method for fabricating flash memory structures and devices associated with dual-bit or other multi-bit SONOS type flash memory cells illustrated and described below. However, it will be appreciated that the invention may be employed in fabricating other types of flash memory devices, such as single and multi-bit cells, or others, and that the invention is not limited to the implementations specifically illustrated and described herein.

Figure 1B:
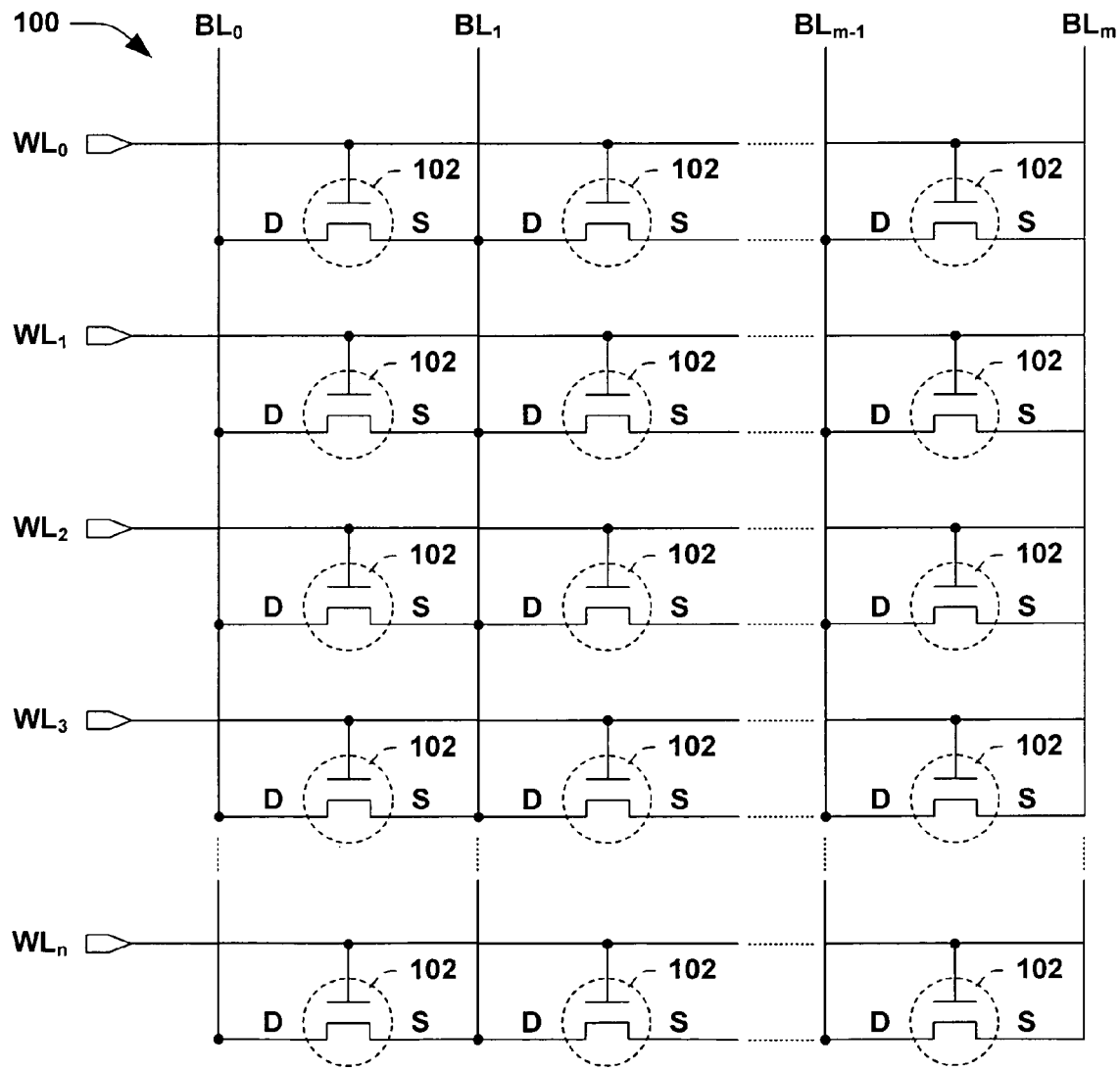
FIG. 1B is a schematic diagram illustrating a portion of an exemplary flash memory array comprising a plurality of dual bit flash memory cells organized in a virtual ground architecture for access using wordlines and bitlines.

Referring initially to FIGS. 1A and 1B, such figures illustrate an exemplary dual bit memory cell 102 and a portion of a virtual ground memory array 100, respectively, including one or more interconnected cells 102 in one exemplary simplified form, which may be fabricated in accordance with the various methods of the invention. The memory cell 102 of FIG. 1A comprises a P-type substrate 104 with an n+ source 105 and an n+ drain 106. The cell 102 further comprises a charge trapping layer such as an ONO layer comprising a silicon nitride layer 103 located between upper and lower $SiO_2$ layers 107 and 108, respectively. A polysilicon gate 109 overlies the upper oxide layer 107, and is doped with an n-type impurity (e.g., phosphorus). The memory cell 102 is operable to store and provide access to two data bits, a left bit represented by the dashed circle A and a right bit represented by the dashed circle B. The dual bit memory cell 102 is generally symmetrical, wherein the drain 106 and the source 105 are interchangeable. For example, the left junction 105 may serve as the source terminal and the right junction 106 as the drain terminal with respect to the right bit B. Likewise, the right junction 106 may serve as the source terminal and the left junction 105 as the drain terminal for the left bit A.

An exemplary array 100 of cells 102 is illustrated in FIG. 1B, comprising rows of flash cells 102 with gate terminals coupled to an associated word line (e.g., $WL_0$ thru $WL_n$), and columns cells 102, with a drain of one cell 102 coupled to an associated bit line (e.g., $BL_0$ thru $BL_m$) and the source of an adjacent cell. It is noted in FIG. 1B that each row of flash cells 102 associated with a word line is connected in series, with the source of one cell 102 coupled to the drain of an adjacent cell 102, wherein each drain terminal of the cells 102 within a single column is connected to the same bit line, sometimes referred to as a virtual ground memory architecture. An individual flash cell 102 may thus be selected via application of appropriate voltages to an associated word line and a pair of bit lines bounding the cell 102 of interest. Although the exemplary array 100 of FIG. 1B is illustrated in the present example, it should be understood that one or more aspects of the present invention are also applicable to other array architectures.

FIGS. 2A-2F, illustrate conventional shallow trench isolation (STI) processing in the fabrication of dual cell SONOS type memory cells in a semiconductor wafer 202 using conventional processing methods for the STI structures. The conventional method of FIGS. 2A-2F begins with the formation of a STI trench opening and STI structure in an isolation region 204 between active regions 206 of a substrate 208.

Figure 2A:
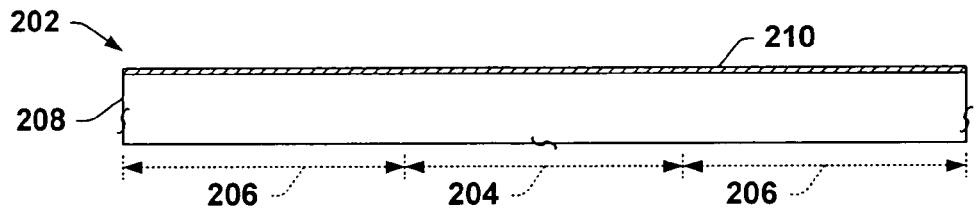
FIGS. 2A-2F are partial side elevation views in section illustrating conventional shallow trench isolation processing of a semiconductor wafer to form an STI structure in a substrate.
Figure 2B:
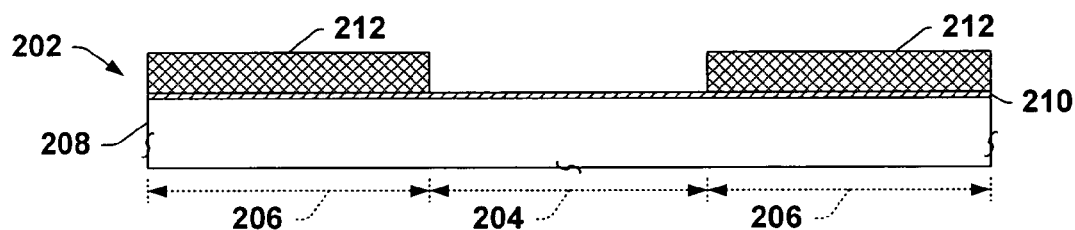

FIG. 2A, for example, illustrates the formation of a nitride layer 210 over the substrate 208 in the semiconductor wafer 202. A patterned resist mask 212 may be formed in FIG. 2B, covering portions of the nitride layer 210 in the active regions 206 and leaving portions of the nitride layer 210 exposed in the isolation region 204.

Figure 2C:
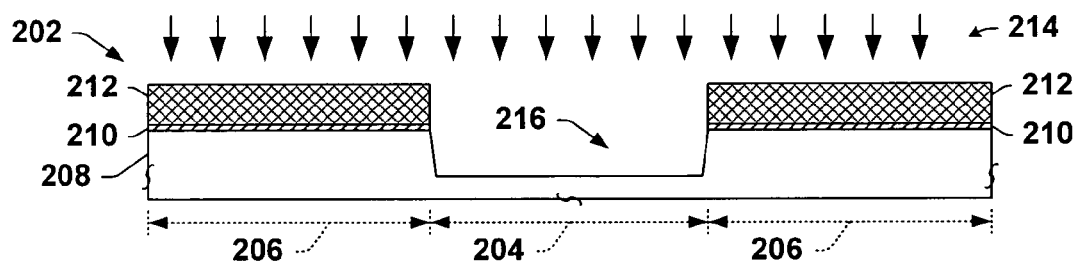
Figure 2D:
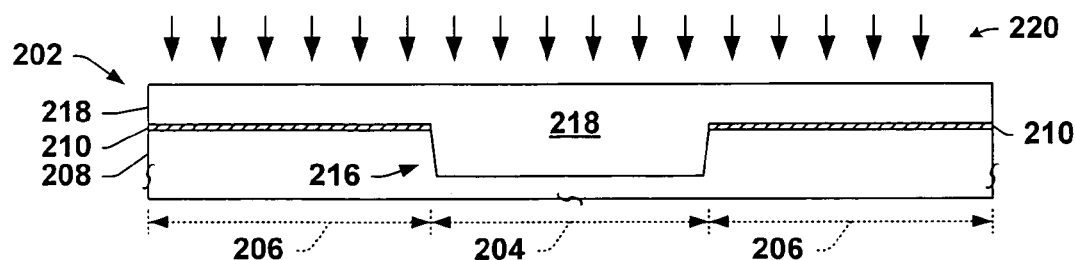
Figure 2E:
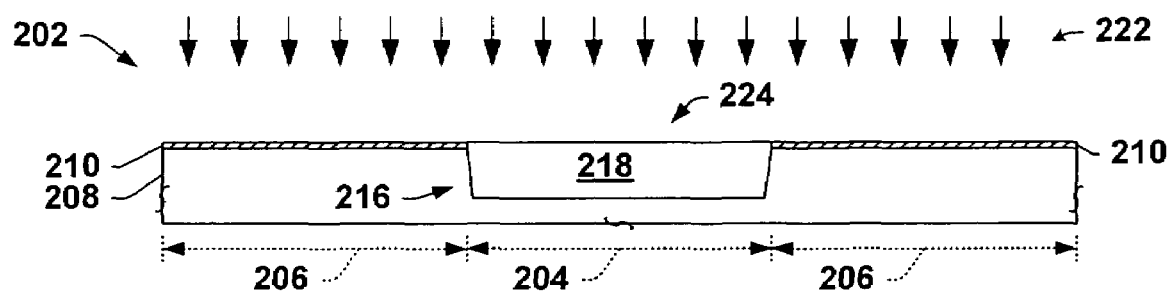
Figure 2F:
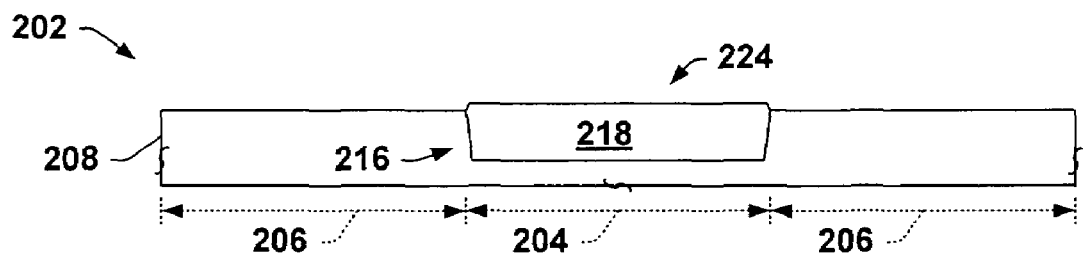

In FIG. 2C, an etch process 214 is employed to form an isolation trench or opening 216 through the nitride layer 210 and into the substrate 208. The resist mask 212 is then removed and the wafer cleaned. In FIG. 2D, a dielectric material layer 218 is formed overlying the nitride layer 210 and filling the isolation trench 216, for example, by a deposition process 220. In FIG. 2E, a planarization process 222, such as a chemical mechanical process (CMP) may be utilized to planarize the wafer, stopping on the nitride layer 210 to isolate the dielectric material 218 from surrounding areas and define an STI structure 224 for electrical isolation of the active areas 206. Finally, the nitride material layer 210 may be removed from the substrate 208, by which the STI structure 224 appears as in FIG. 2F. Note that the resulting structure 224 has a step height that extends above the substrate 208 an extent that coincides with the height of the nitride layer 210.

Figure 3A:
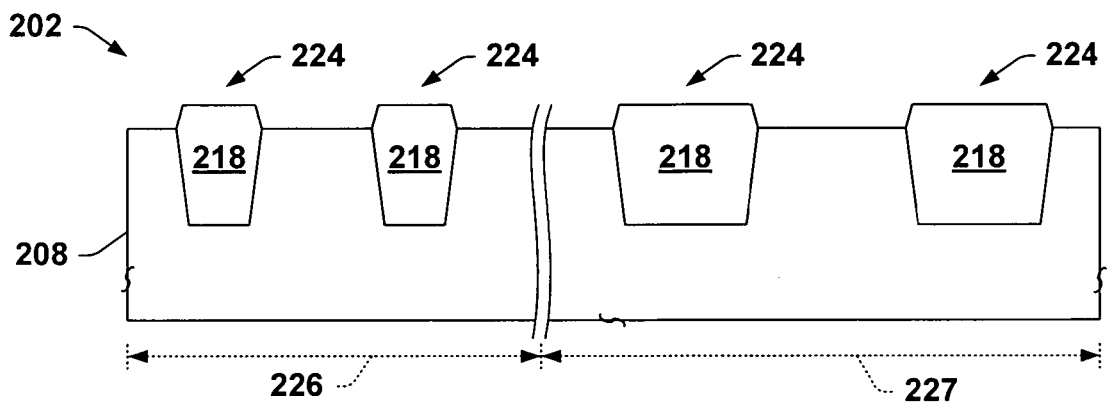
FIGS. 3A-3C are partial side elevation views in section illustrating further details of conventional shallow trench isolation processing of a semiconductor wafer for the formation of STI structures in a core region and a periphery region of a substrate including residual ONO stringers that may be produced therein.
Figure 3B:
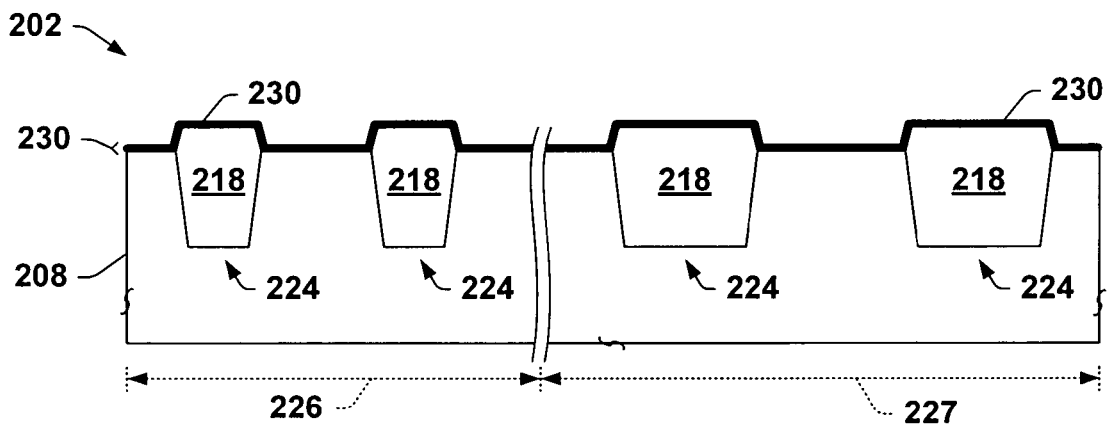
Figure 3C:
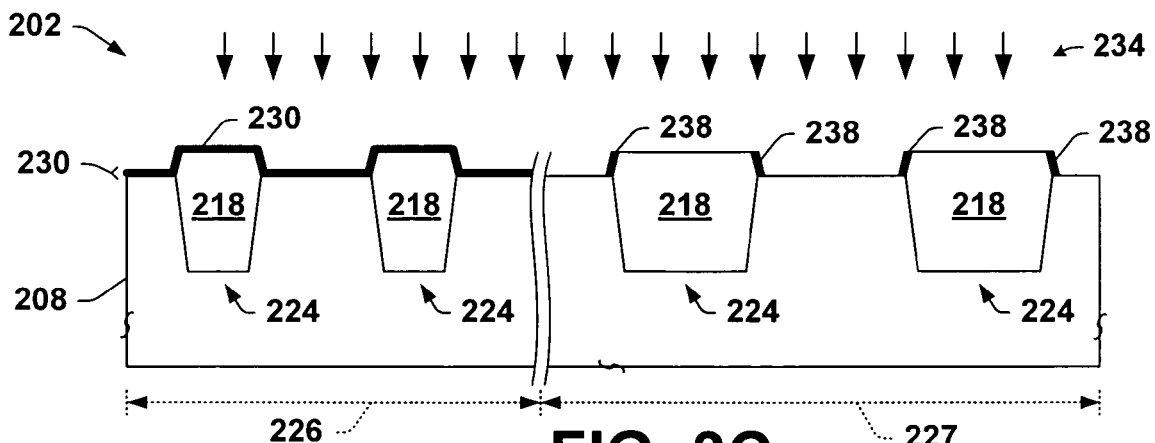

FIGS. 3A-3C illustrate further details and a problem of the conventional shallow trench isolation processing for the formation of multiple STI structures according to the conventional method of FIGS. 2A-2F.

FIG. 3A, for example, illustrates several completed STI structures 224, conventionally formed in a core region 226 and a periphery region 227 of a substrate 208 similar to that of FIGS. 2A-2F. In FIG. 3B, an ONO layer 230 is formed overlying the substrate 208 and STI structures 224 in both the core region 226 and the periphery region 227 of the wafer 202. Then, an anisotropic etch 234 may be utilized as illustrated in FIG. 3C to remove the ONO layer 230 in the periphery region 227, and protected by, for example, a mask layer (not shown) in the core region 226. Thereafter, additional conventional processing may continue throughout the wafer 202.

However, as is also illustrated in the conventional method of FIG. 3C, because the anisotropic etch 234 is selective to the horizontal surfaces of the ONO layer, residual ONO stringers 238 may be detrimentally produced on the lateral surfaces (edges) of the conventional STI structures 224 in the periphery region 227.

Figure 4:
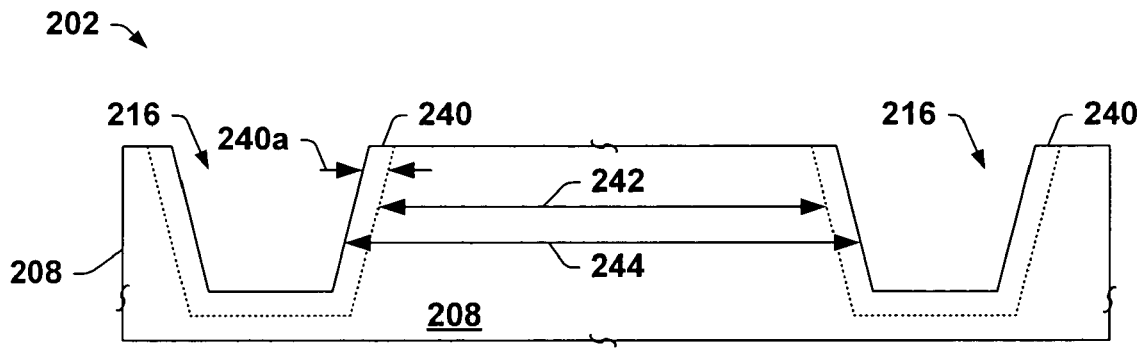
FIG. 4 is a partial side elevation view in section illustrating active loss effects that may occur between STI trenches when formed in a substrate according to a conventional STI fabrication method.
Figure 5:
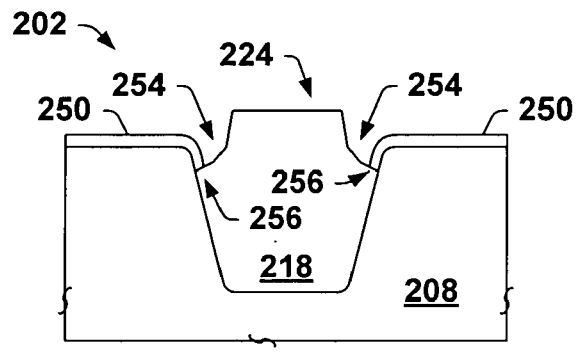
FIG. 5 is a partial side elevation view in section illustrating oxide thinning that may occur at the edges of STI structures due to a cleaning process performed according to a conventional STI fabrication method.
Figure 6:
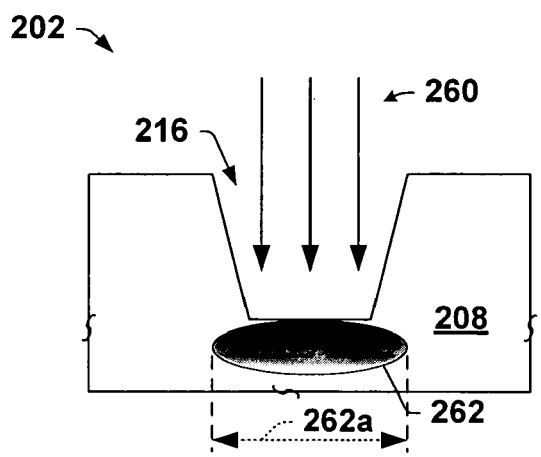
FIG. 6 is a partial side elevation view in section illustrating the effects of excessive dopant diffusion that may occur within the substrate below an STI trench after implantation and several extra thermal processing steps performed according to a conventional STI fabrication method.

FIGS. 4-6 illustrate other problems associated with one or more conventional methods of forming STI isolation structures in a wafer 202 of FIGS. 2A-2F and 3A-3C.

FIG. 4, for example, illustrates a loss of the active region in a conventional STI fabrication method. When the isolation trenches 216 are formed in isolation regions 204 of the substrate 208, subsequent additional oxidation and thermal processing steps cause an increase in the thickness 240a of the oxidation layer 240 by consumption of the silicon exposed within the trenches 216. Because of this thickening oxide layer 240, the active region 242 remaining between the isolation trenches 216 becomes reduced from that of the original silicon material 244. Thus, less active region 242 remains useful for flash memory device purposes in one or more conventional STI fabrication methods.

FIG. 5 illustrates an oxide thinning problem that may occur at the edges of STI structures due to a cleaning process performed in a conventional STI fabrication method in the wafer 202. Conventionally, after filling an isolation trench 216 with the dielectric material 218 and before forming a gate oxide or a first oxide 250 of an ONO layer, a wet cleaning process is required. The cleaning process usually requires a wet oxide etching by using DHF (diluted hydrofluoric acid). This wet oxide etching, may form dips or pits 254 and consequent oxide thinning areas 256 at the edges of the STI structure 224. The oxide thickness at the STI edge tends to be thinner than that of the flat regions, which is most likely caused by mechanical stress.

FIG. 6 illustrates the deleterious effects of excessive dopant diffusion in a conventional STI fabrication method. In a conventional STI fabrication method, the dopant implanted 260 within the substrate 208 below an STI trench 216 may become excessively diffused following several extra thermal processing steps. Such thermal processing steps may include oxidation processing or thermal annealing operations. As these thermal processes continue, the isolation implant region 262 below the trench 216 effectively widens 262a as the dopant diffuses. Thus, the electrical isolation between two devices is reduced and changes the device characteristics of a transistor, for example, the threshold voltage Vt of the transistor. In addition, it is desirable that the dopant of the isolation implant remain under the STI, however, with the added thermal processing steps of the conventional flow, the dopant diffuses and some of the dopant comes to the surface of the silicon, detrimentally altering the device characteristics.

Figure 7A:
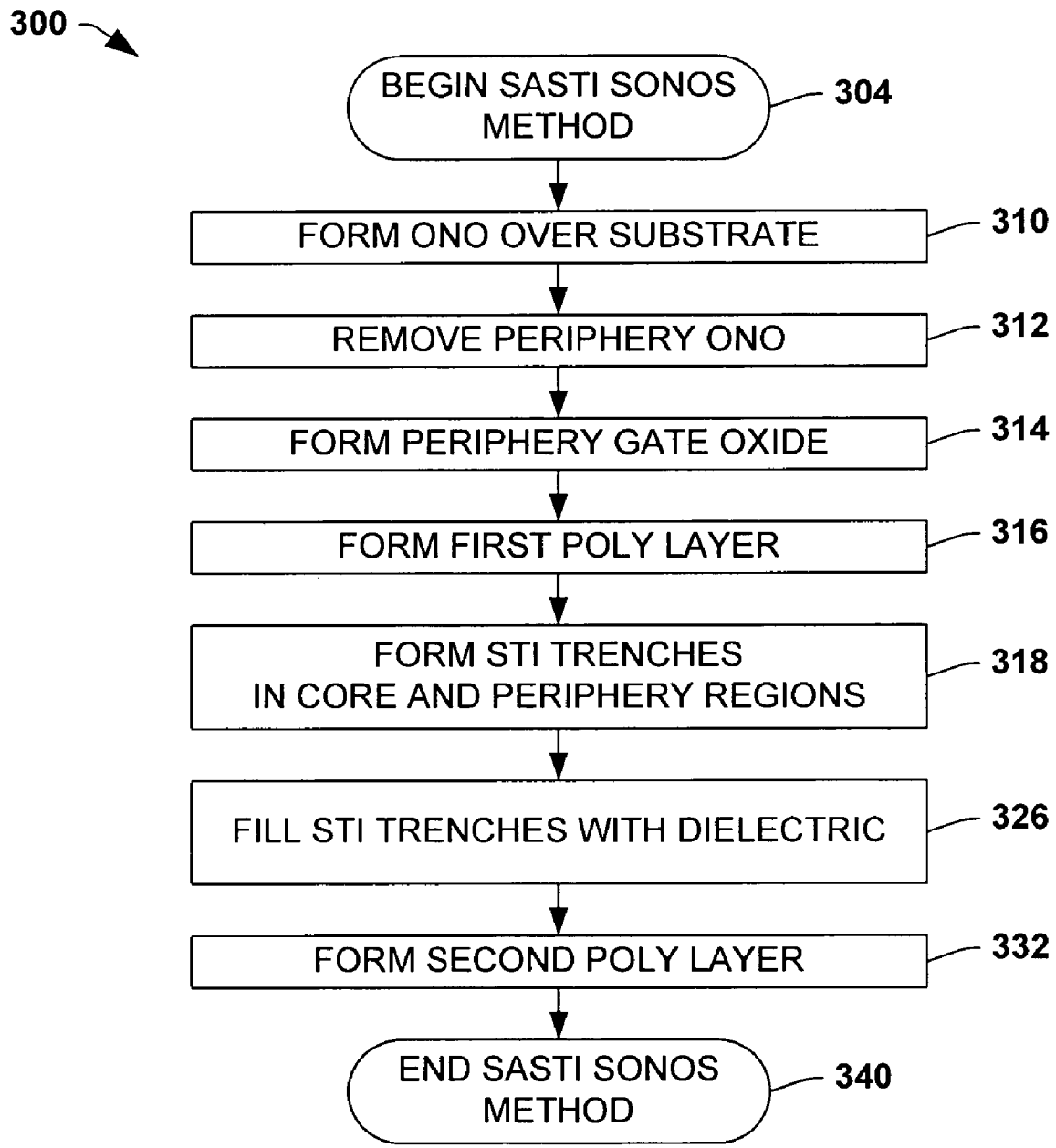
FIGS. 7A and 7B flow diagrams illustrating exemplary methods of fabricating multi-bit SONOS type flash memory devices having isolation structures in accordance with the present invention.
Figure 7B:
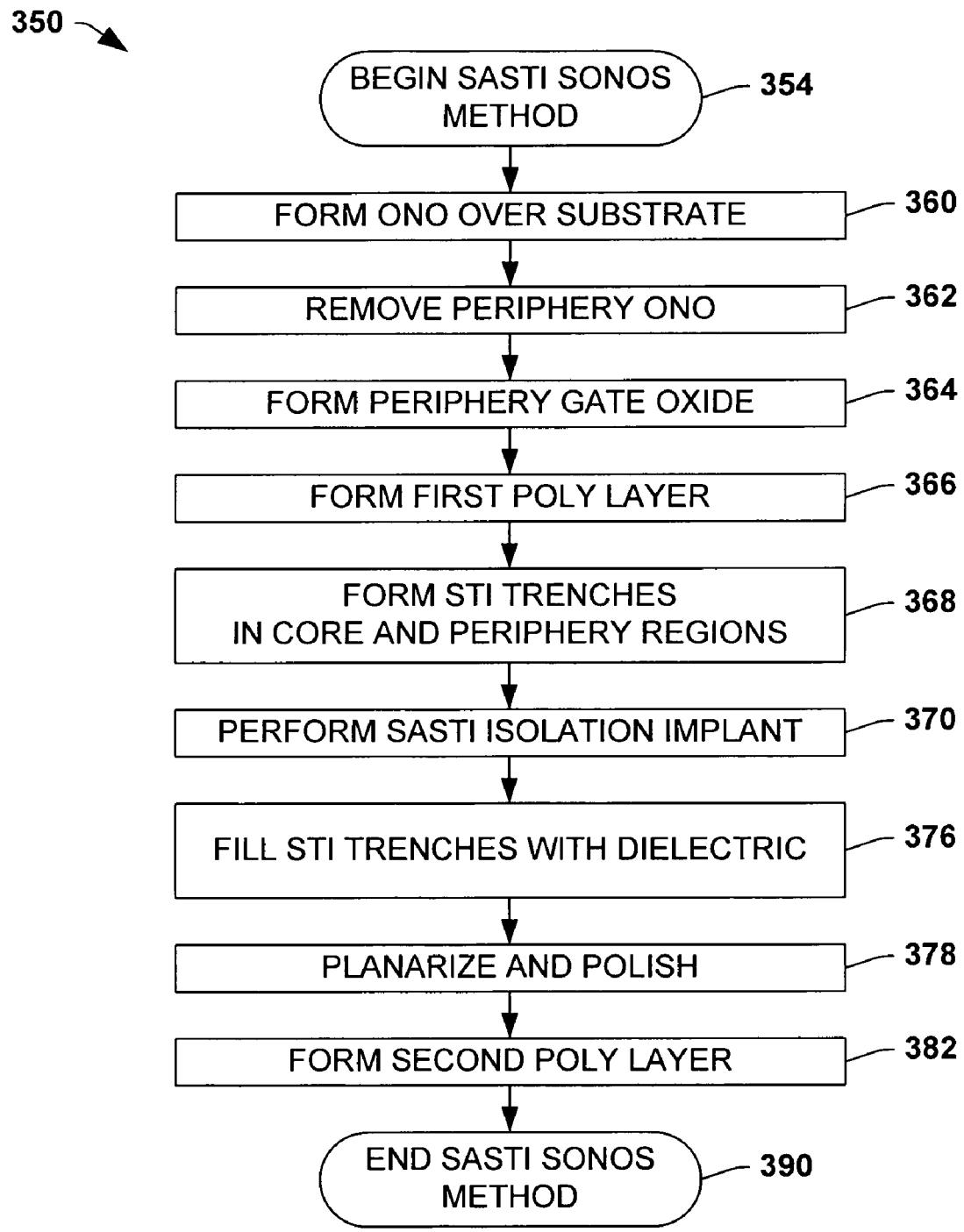

In FIGS. 7A and 7B, exemplary methods 300 and 350 are illustrated for fabricating flash memory cells in a wafer in accordance with one or more aspects of the present invention. Although the methods 300 and 350 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the methods 300 and 350 or variants thereof, may be used in manufacturing dual bit memory devices and their associated structures, as illustrated and described below with respect to FIGS. 8-24. Accordingly, the methods 300 and 350 may be implemented in a core region, the periphery region, or concurrently in both regions of the wafer.

Method 300 of FIG. 7A, for example, begins at 304, wherein a multi-layer dielectric-charge trapping-dielectric stack such as a multi-layer ONO stack is formed at 310 overlying a substrate, using standard processes. Any appropriate process steps and materials may be employed in forming the ONO layer at 310, including oxidation and/or deposition techniques as are known. The layers formed at 310 can be any other dielectric-charge trapping-dielectric multi-layer stack, including but not limited to an ONO stack. In the case of oxide dielectrics, any of the oxide layers can include nitride or other dopants for optimal device and reliability performance. In addition, the nitride layer can be rich in Si, N, and/or dopants such as oxygen to facilitate enhanced device performance and reliability performance. The multi-layer ONO stack overlying the substrate may, for example, comprise a first oxide layer overlying the substrate of the wafer, a nitride layer overlying the first oxide layer, and a second oxide layer overlying the nitride layer, or another such multi-layer ONO type stack.

At 312, the ONO stack is removed from the periphery region of the wafer down to the substrate to define the ONO stack in the core region of the wafer. The ONO stack may be removed in the periphery region, for example, using an etch process. At 314, a gate dielectric layer or gate oxide layer (e.g., $SiO_2$) is then formed (e.g., grown via oxidation) overlying the substrate in the periphery region, for example, using a deposition or an oxidation process.

At 316, a first polysilicon layer is then formed over the ONO stack in the core region and over the gate dielectric layer in the periphery region. The first polysilicon layer may be used as a polysilicon gate structure. At 318, an opening is then concurrently formed in the substrate, through the first polysilicon layer and the ONO stack in the core region, and through the first polysilicon layer and the gate dielectric layer in the periphery region, thereby defining isolation trenches in both regions of the wafer. Thus formed, the isolation trenches further define active regions of the wafer between the isolation trenches of the core region and/or the periphery region. Such isolation trench openings may be formed by selectively applying a photoresist mask material to wafer active regions and etching down into the substrate material. Thereafter, the masking material or structures may then be removed from the wafer active regions, for example, using a wet etching operation and the wafer cleaned.

After forming the isolation trenches, and before the trenches are filled, the bottom portions of the trenches may be implanted (not shown) with a dopant ion species (e.g., B, $BF_2$, or a p-type dopant) thru the trench openings and into the substrate to improve the electrical isolation.

At 326, the isolation trench openings are filled (e.g., via an oxidation or deposition process) with a dielectric (e.g., $SiO_2$) material. After filling the trenches with the dielectric material, and if needed, the wafer may then be planarized (e.g., using a CMP process, not shown) to separate individual isolation structures.

Finally at 332, a second polysilicon layer or another such conductive material layer is then formed over the first polysilicon layer and the filled trenches, for example, to define conductive wordline structures, or to interconnect polysilicon gates to corresponding wordlines. The deposition of either the first or second polysilicon layer may be accomplished using chemical vapor deposition (CVD) processes or other such process that are known, followed by a patterning thereof. The exemplary method 300 of FIG. 7A ends at 340, after which further process steps (not shown) may be performed to fabricate other structures and devices of the wafer (e.g., patterning the poly gates in the periphery, source/drain implants, etc.), followed by metallization and other back end processing.

In another exemplary aspect of the present invention, method 350 of FIG. 7B begins at 354, wherein a multi-layer dielectric-charge trapping-dielectric stack such as a multi-layer ONO stack is formed at 360 overlying a substrate, using standard processes. Any appropriate process steps and materials may be employed in forming the ONO layer at 360, including oxidation and/or deposition techniques as are known. The layers formed at 360 can be any other dielectric-charge trapping-dielectric multi-layer stack, including but not limited to an ONO stack. In the case of oxide dielectrics, any of the oxide layers can include nitride or other dopants for optimal device and reliability performance. In addition, the nitride layer can be rich in Si, N, and/or dopants such as oxygen to facilitate enhanced device performance and reliability performance. The multi-layer ONO stack overlying the substrate of the wafer, a nitride layer overlying the first oxide layer, and a second oxide layer overlying the nitride layer, or another such multi-layer ONO type stack.

At 362, the ONO stack is removed from the periphery region of the wafer down to the substrate to define the stack in the core region of the wafer. The ONO stack may be removed, for example, using an etch process. At 364, a gate dielectric layer or gate oxide layer (e.g., $SiO_2$) is then formed (e.g., via oxidation) overlying the substrate in the periphery region, for example, using a deposition or an oxidation process.

At 366, a first polysilicon layer is then formed over the ONO stack in the core region and over the gate dielectric layer in the periphery region. The first polysilicon layer may be used as a polysilicon gate structure. At 368, an opening is then concurrently formed in the substrate, through the first polysilicon layer and the ONO stack in the core region, and through the first polysilicon layer and the gate dielectric layer in the periphery region, thereby defining isolation trenches in both regions of the wafer. Thus formed, the isolation trenches further define active regions of the wafer between the isolation trenches of the core region and/or the periphery region. Such isolation trench openings may be formed by selectively applying a photoresist mask material to wafer active regions and etching down into the substrate material. Thereafter, the masking material or structures may then be removed from the wafer active regions, for example, using a wet etching operation and the wafer cleaned.

At 370, after forming the isolation trenches, and before the trenches are filled, they may be implanted with a dopant ion species (e.g., B, $BF_2$, or a p-type dopant) thru the trench openings and into the substrate to improve the electrical isolation.

At 376, the isolation trench openings are filled (e.g., via an oxidation or deposition process) with a dielectric (e.g., $SiO_2$) material. After filling the trenches with the dielectric material, and if needed, the wafer may then be planarized and polished (e.g., using a CMP process) at 378 to separate individual isolation structures.

Finally at 382, a second polysilicon layer or another such conductive material layer is then formed over the first polysilicon layer and the filled trenches, for example, to define conductive wordline structures, or to interconnect polysilicon gates to corresponding wordlines. The deposition of either the first or second polysilicon layer may be accomplished using chemical vapor deposition (CVD) processes or other such process that are known, followed by a patterning thereof. The exemplary method 350 of FIG. 7B ends at 390, after which further process steps (not shown) may be performed to fabricate other structures and devices of the wafer, followed by metallization and other back end processing.

Thereafter, FIGS. 8-24 illustrate fabrication of memory cells in accordance with the exemplary methods of the present invention.

Figure 12:
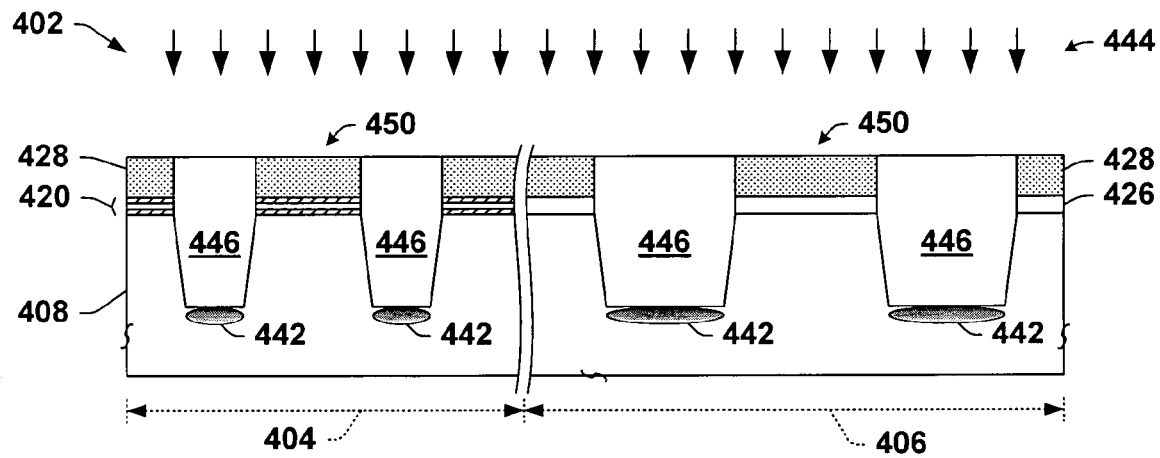
FIG. 12 is a partial side elevation view in section illustrating filling the isolation trenches with a dielectric material in the wafer of FIG. 11, and subsequent optional planarization and polishing of the wafer.
Figure 13:
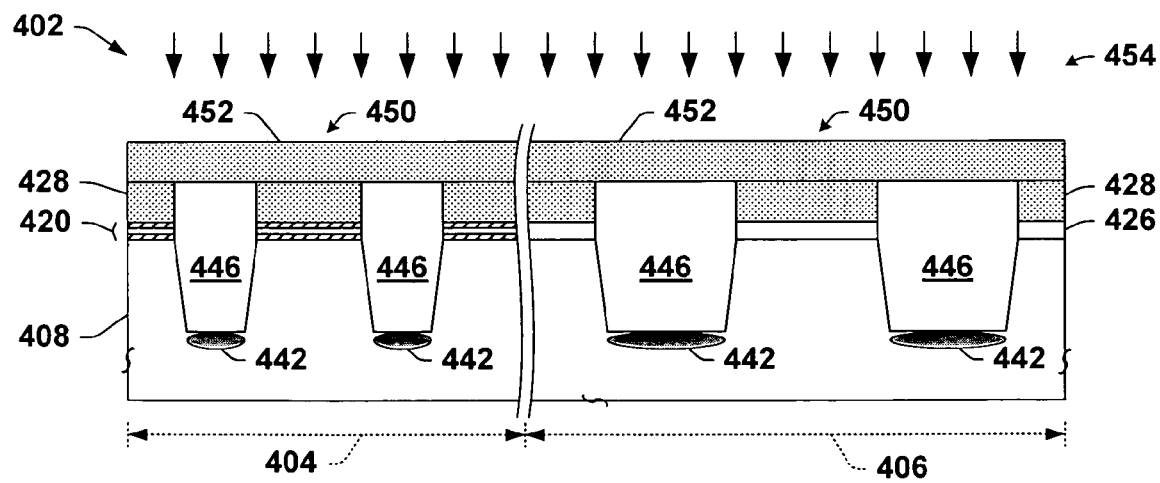
FIG. 13 is a partial side elevation view in section illustrating formation of a second polysilicon layer over the first polysilicon layer and the filled trenches in the wafer of FIG. 12.
Figure 14:
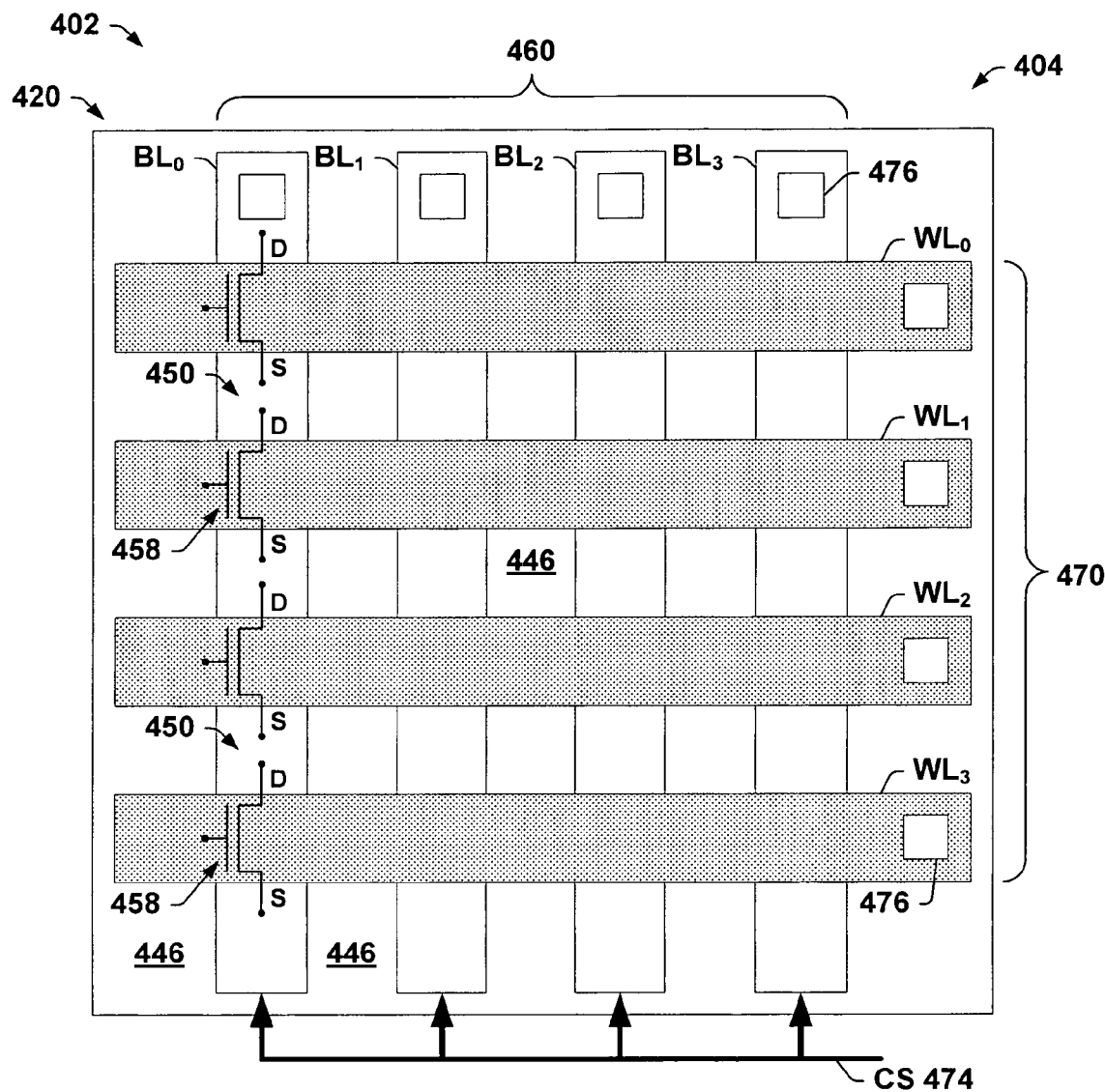
FIG. 14 is a top plan view of the core region of a SONOS flash memory device comprising a single or multi-bit NAND array such as may be fabricated in accordance with one aspect of the invention of the method of FIGS. 7A, 7B, and 8-13.
Figure 15:
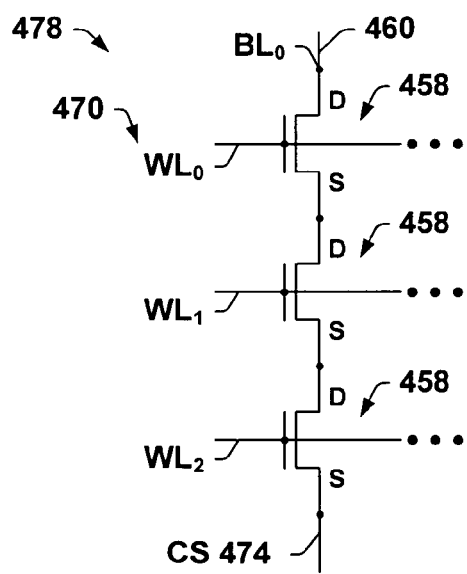
FIG. 15 is a schematic diagram of several transistors of the flash memory device of FIG. 14, the transistors series connected along a bitline to a common source connection.

FIGS. 8-13, illustrate cross sectional views of the fabrication of isolation structures in the core region and periphery region of a semiconductor wafer 402 of an exemplary SONOS type single or multi-bit NAND array of FIGS. 14 and 15, such as may be fabricated in accordance with one aspect of the invention of the method 300 of FIG. 7A and method 350 of FIG. 7B. The method of FIGS. 8-13 further illustrates the formation of an isolation trench opening and structure in a core region 404 and a periphery region 406 of a substrate 408.

Figure 8:
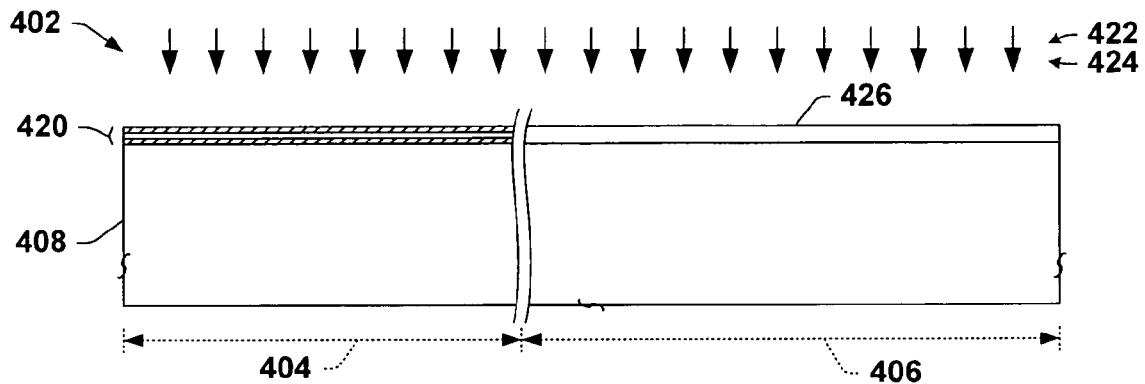
FIG. 8 is a partial side elevation view in section illustrating an exemplary method of formation of an ONO multi-layer stack over the substrate in a core region of a wafer, and the formation of a gate oxide over the substrate in a periphery region of the wafer in accordance with the methods of FIGS. 7A and 7B.

In FIG. 8, an exemplary multilayer ONO stack 420 is initially formed over the substrate 408 of wafer 402 in accordance with steps 310 or 360 of the method of FIGS. 7A and 7B, respectively. The multilayer ONO stack 420 may comprise, for example, a first oxide layer, such as $SiO_2$ formed over the substrate 408, as well as a nitride layer formed over the first oxide, and second oxide layer formed over the nitride layer. For example, these materials may be formed by individual deposition and/or oxidation steps, generally indicated by 422. As discussed previously, the multilayer stack may comprise other combinations of layers and materials suitable for a multi-bit SONOS NAND type array, such as in FIGS. 14 and 15. The ONO layer 420 is then removed from the periphery region 406, for example, by an etch process, and as discussed in connection with steps 312 or 362 of FIGS. 7A and 7B, respectively.

Further illustrated in FIG. 8, a gate dielectric layer or gate oxide layer (e.g., $SiO_2$) 426 (not drawn to scale) is then formed, such as in steps 314 or 364, overlying the substrate 408 in the periphery region 406, for example, using a deposition or oxidation process 424.

Figure 9:
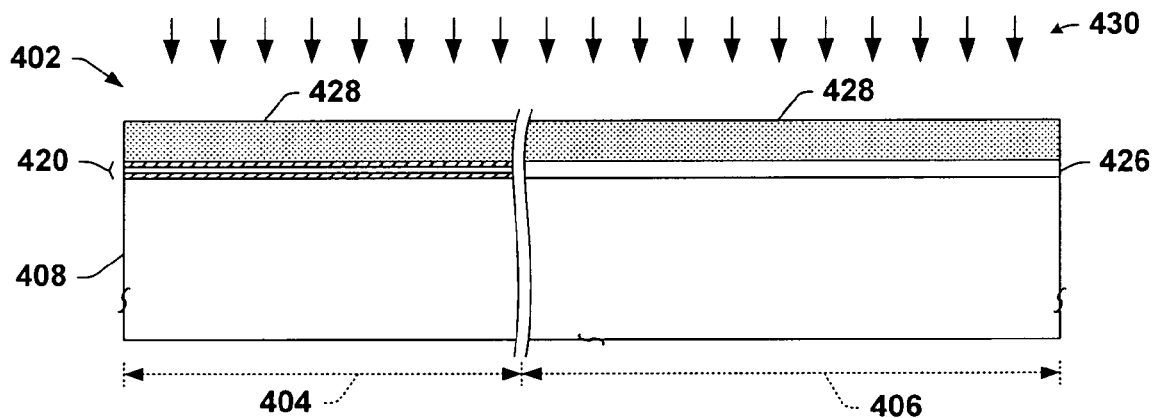
FIG. 9 is a partial side elevation view in section illustrating formation of a first polysilicon layer over the ONO stack in the core region and the gate dielectric in the periphery region in the wafer of FIG. 8.

In FIG. 9, a first polysilicon layer 428 is then formed, as in method steps 316 or 366, for example, by a deposition 430 over the ONO stack 420 in the core region 404 and the gate dielectric 426 in the periphery region 406 in the wafer 402 of FIG. 8.

Figure 10:
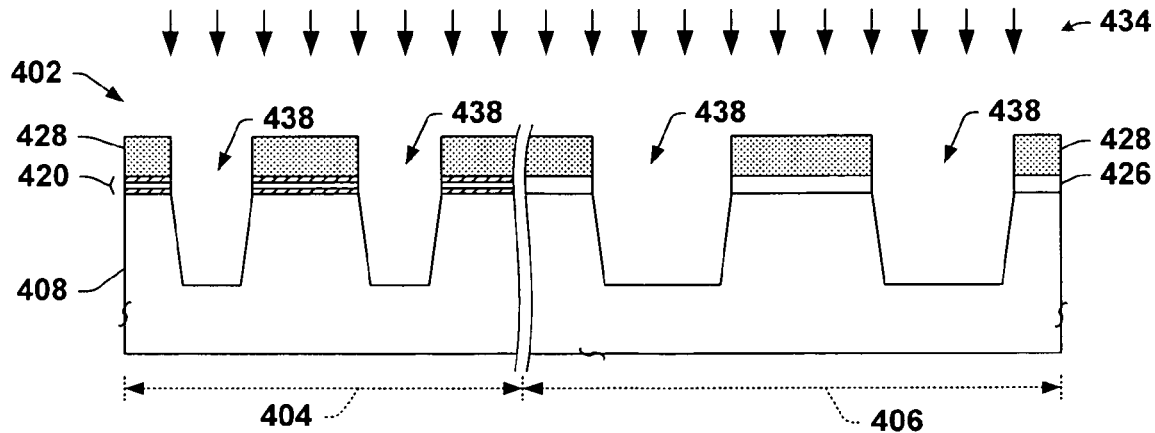
FIG. 10 is a partial side elevation view in section illustrating concurrent formation of an isolation trench in the substrate, through the first polysilicon layer and the ONO stack in the core region and through the first polysilicon layer and the gate dielectric layer in the periphery region in the wafer of FIG. 9.

In FIG. 10, isolation trenches are then concurrently formed in the core region 404 and in the periphery region 406 of wafer 402, as in method steps 316 or 366, for example, by an etch process 434 (etch mask not shown). Etching 434, concurrently proceeds into the substrate 408, through the first polysilicon layer 428 and the ONO stack 420 in the core region 404 and through the first polysilicon layer 428 and the gate dielectric layer 426 in the periphery region 406, thereby defining shallow isolation trenches (STIs) 438 in the wafer 402 of FIG. 9. Any appropriate process steps and materials may be employed in patterning and etching the first polysilicon layer 428, the ONO stack 420, and the gate dielectric layer 426, including dry etch chemistries as are known. By forming the STI trenches after the formation of the ONO layer 420, ONO stringers are avoided in the periphery region.

Figure 11:
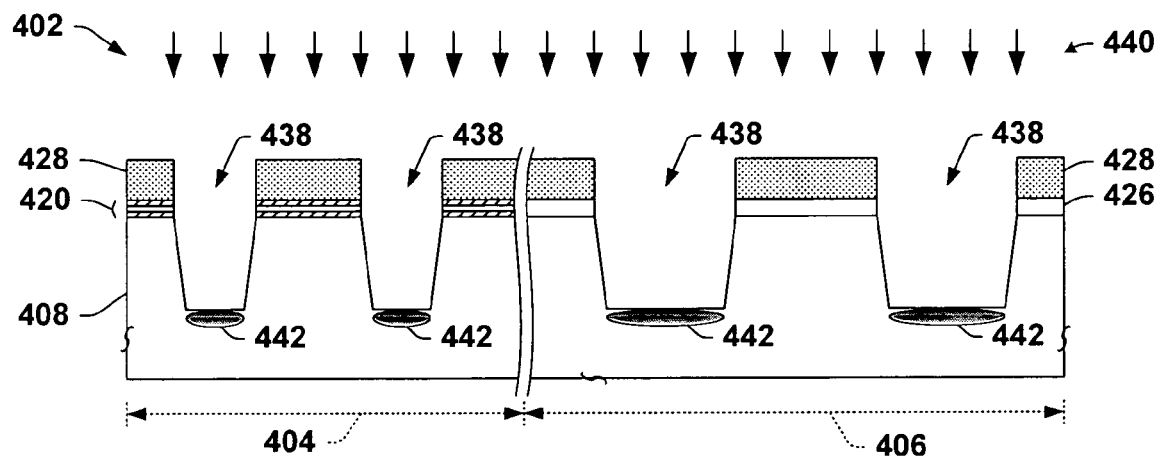
FIG. 11 is a partial side elevation view in section illustrating an isolation implantation of a dopant ion species into the substrate associated with the isolation trenches in the wafer of FIG. 10.

In FIG. 11, a dopant, such as B, $BF_2$, or another p-type ion species is then implanted, as in method step 370, for example, using a SASTI isolation implantation process 440 into the substrate 408 through the associated isolation trenches 438, forming a SASTI isolation region 442 in the wafer 402 of FIG. 10. In accordance with the methods of the present invention, the SASTI isolation region 442, becomes possible because fewer thermal process steps (e.g., fewer oxidation and annealing thermal processes) are utilized herein because the ONO and gate oxide have already been formed. The reduced number of thermal processes results in less dopant diffusion (or maintained dopant concentration) of the SASTI isolation region 442, thereby providing better electrical isolation of the isolation structure subsequently formed. This effect will be discussed further in connection with the diffusion illustrated in prior art FIG. 6 compared to that of FIGS. 11, 19, and 24.

In FIG. 12, the isolation trenches 438 are filled, as in method steps 326 or 376, for example, by a deposition process 444 with a dielectric material (e.g., $SiO_2$) 446 in the wafer 402 of FIG. 11. The wafer may be subsequently planarized (not shown) to define the dielectric material into SASTI isolation structures 446. Optionally, selected portions of the first polysilicon layer 428, and other subsequent poly layers may then be patterned and etched (not shown) to form polysilicon gate structures in active regions 450 of the wafer 402 between the SASTI isolation structures 446. Patterning may be accomplished using a photoresist, a nitride material layer, or other selective materials or structures. Thereafter, the patterning material or structures used for masking may then be removed from the wafer active regions 450, for example, using a wet or dry etching operation and the wafer 402 is cleaned, for example, with a rinse process.

Finally in FIG. 13, a second polysilicon layer 452 is formed, as in method steps 332 and 382, for example, by a deposition process 454 over the first polysilicon layer 428 and the SASTI isolation structures 446 in the wafer 402 of FIG. 12. Second polysilicon layer 452, for example, may be used together with the first polysilicon layer 428 to form polysilicon gate structures, to define conductive wordline structures, or to interconnect polysilicon gates to corresponding wordlines. The deposition of either the first or second polysilicon layer may be accomplished using chemical vapor deposition (CVD) processes or other such process that are known, followed by a patterning thereof. Thereafter, the exemplary implementation of the methods of the present invention ends, after which further process steps (not shown) may be performed to fabricate other structures (e.g., gate patterning, source/drain implants, silicidation, etc.) and devices of the wafer, followed by metallization and other back end processing.

FIG. 14 illustrates at least a portion of the core region 404 of the SONOS flash memory device 402 (wafer) such as may be fabricated in accordance with one aspect of the invention of the method of FIGS. 7A, 7B, and 8-13. SONOS flash memory device 402 comprises a single or multi-bit NAND array of transistors 458, series connected source to drain along columns of bitlines (e.g., $BL_0$, $BL_1$, $BL_2$, $BL_3$) 460, with gates connected for selection by rows of wordlines (e.g., $WL_0$, $WL_1$, $WL_2$, $WL_3$) 470. One end of the bitlines 460 of the NAND array memory device 402 are connected to a common source 474. Exemplary conductive (e.g., metal) vias or contacts 476 on the bitlines 460 and the wordlines 470, provide interconnection to address decoders or other such devices (not shown) as may be required in the periphery region 406 of memory device 402.

Thus, in accordance with the methods of the present invention, the SASTI isolation structures 446 define and isolate active regions 450, and in the case of the single or multi-bit NAND array memory device 402, the active regions 450 comprise bitlines 460 and source/drain regions of the transistors 458, further comprising the ONO layer 420 for charge retention of each bit of the array.

Advantageously, the method of the present invention, avoids the conventional fabrication problems of residual ONO stringers, by patterning the STI trenches after forming the ONO, which affect production yield due to particles of the ONO residual dislodging during processing, thus easing manufacturing. The method also avoids oxide thinning at the STI edges because a conventional cleaning process is avoided by the ordering of the layer formations wherein the ONO and gate oxide layers are protected by the overlying polysilicon layers during formation of the trenches and STI structures. In addition, because the SASTI isolation implant experiences fewer thermal processes after its formation than conventional processes, subsequent dopant diffusion is minimized to provide better electrical isolation with the SASTI isolation structures 446. Thus, the SASTI trench 438 makes possible self-alignment of the SASTI implant 440, when utilized, providing improved shallow trench electrical isolation and less active loss in the core 404 as well as the periphery 406.

FIG. 15 further illustrates a portion of an exemplary column 478 of the SONOS transistors 458 of the flash memory device 402 of FIG. 14, with the transistors 458 series connected along an exemplary bitline (e.g., $BL_0$) 460, to a common source connection 474.

Figure 20:
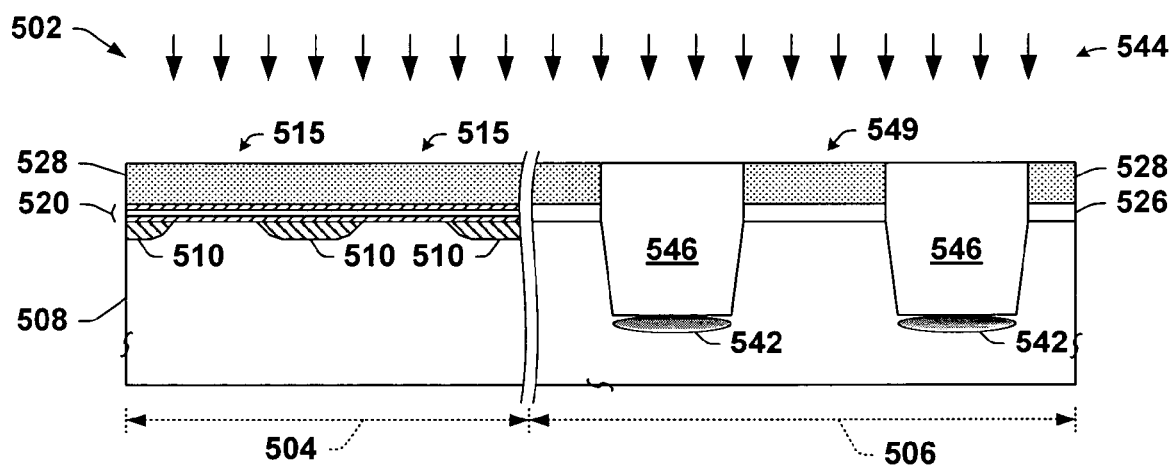
FIG. 20 is a partial side elevation view in section illustrating filling the isolation trenches with a dielectric material in the wafer of FIG. 19, and subsequent optional planarization and polishing of the wafer.
Figure 21:
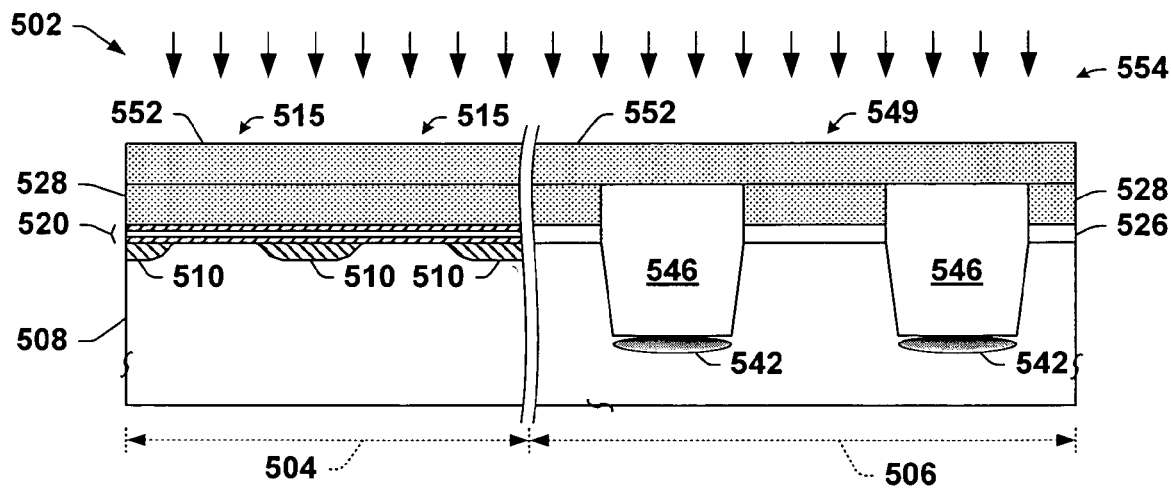
FIG. 21 is a partial side elevation view in section illustrating formation of a second polysilicon layer over the first polysilicon layer and the filled trenches in the wafer of FIG. 20.
Figure 22:
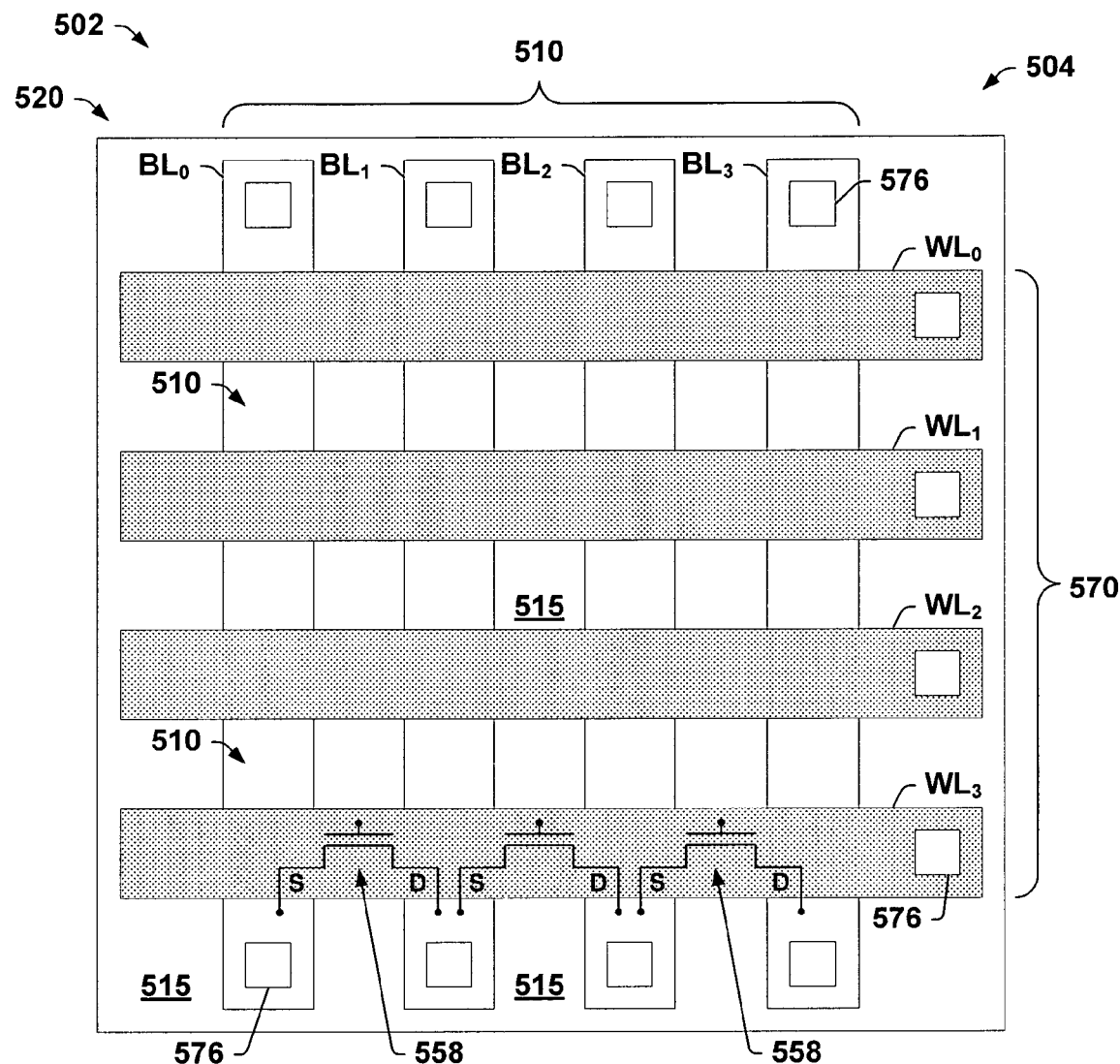
FIG. 22 is a top plan view of the core region of a SONOS flash memory device comprising a single or multi-bit virtual ground array such as may be fabricated in accordance with an aspect of the invention of the methods of FIGS. 7A, 7B, and 16-21.
Figure 23:
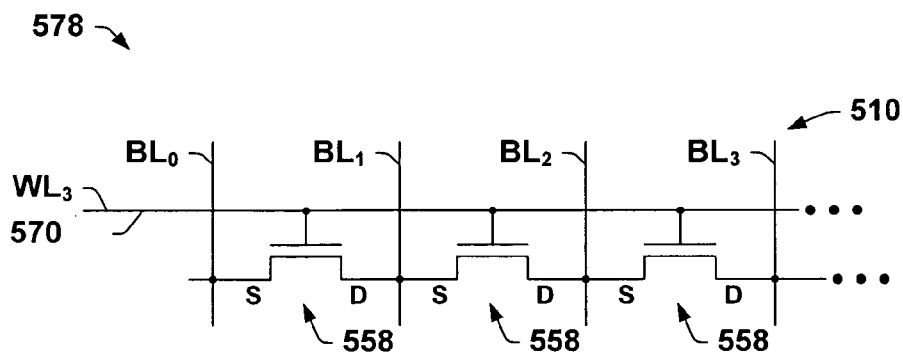
FIG. 23 is a schematic diagram of several transistors of the flash memory device of FIG. 22, the transistors series connected along a wordline.

FIGS. 16-23, illustrate cross sectional views of the fabrication of isolation structures in the periphery region of a semiconductor wafer 502 of an exemplary SONOS type single or multi-bit virtual ground array architecture of FIGS. 22 and 23, such as may be fabricated in accordance with one aspect of the invention of the method 300 of FIG. 7A or method 350 of FIG. 7B. Initially, in one implementation, a core region 504 of a substrate 508 may be implanted with a dopant to form diffused bitlines 510 and channel regions 515 therebetween for transistors of the array. The method of FIGS. 16-23 illustrates the formation of an isolation trench opening and structure in a periphery region 506 of a substrate 508. Although the bitlines 510 and channel regions 515 are illustrated and described as being fabricated before the method begins, it will be appreciated by those in the art that such bitline 510 and channel region 515 fabrication may occur concurrently, or in another order.

Figure 16:
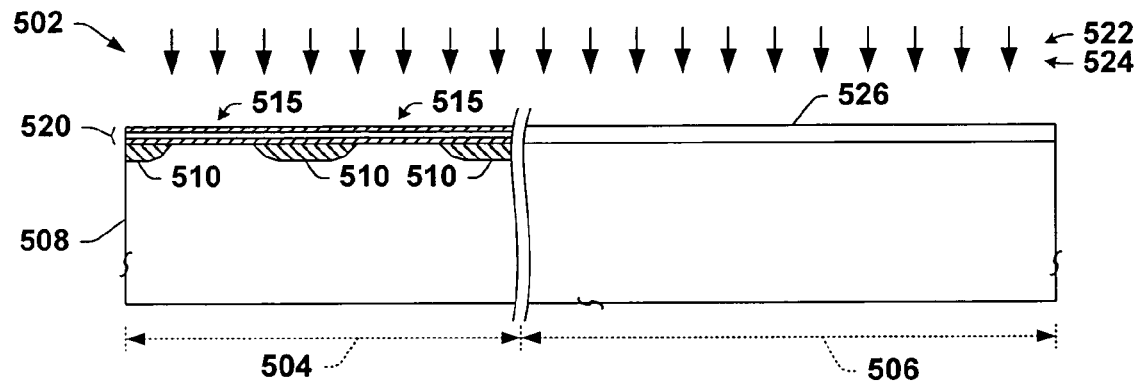
FIG. 16 is a partial side elevation view in section illustrating another exemplary method of formation of an ONO multilayer stack over the substrate in a core region of a wafer, and the formation of a gate oxide over the substrate in a periphery region of the wafer in accordance with the methods of FIGS. 7A and 7B, when an STI is not needed in the core region.

In FIG. 16, an exemplary multilayer ONO stack 530 is initially formed over the substrate 508 of wafer 502 in accordance with steps 310 or 360 of the method of FIGS. 7A and 7B, respectively. The multilayer ONO stack 520 may comprise, for example, a first oxide layer, such as $SiO_2$ formed over the substrate 508, as well as a nitride layer formed over the first oxide, and second oxide layer formed over the nitride layer. For example, these materials may be formed by individual deposition and/or oxidation steps, generally indicated by 522. As discussed previously, the multilayer stack may comprise other combinations of layers and materials suitable for a multi-bit SONOS type array, such as in FIGS. 22 and 23. The ONO layer 520 is then removed from the periphery region 506, for example, by an etch process 522 as discussed in connection with steps 312 or 362 of FIGS. 7A and 7B, respectively.

Further illustrated in FIG. 16, a gate dielectric layer or gate oxide layer (e.g., $SiO_2$) 526 is then formed, such as in steps 314 or 364, overlying the substrate 508 in the periphery region 506, for example, using a deposition or oxidation process 524.

Figure 17:
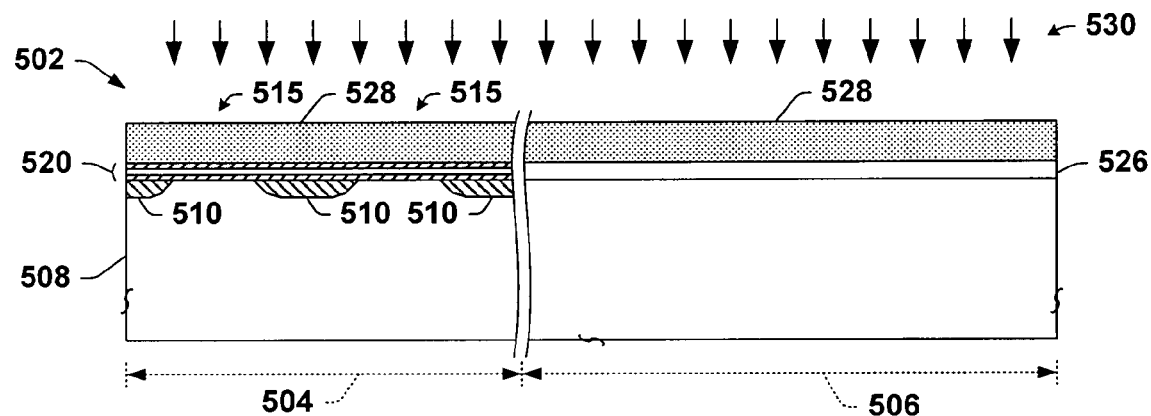
FIG. 17 is a partial side elevation view in section illustrating formation of a first polysilicon layer over the ONO stack in the core region and the gate dielectric in the periphery region in the wafer of FIG. 16.

In FIG. 17, a first polysilicon layer 528 is then formed, as in method steps 316 and 366, for example, by a deposition 530 over the ONO stack 520 in the core region 504 and the gate dielectric 526 in the periphery region 506 in the wafer 502 of FIG. 16.

Figure 18:
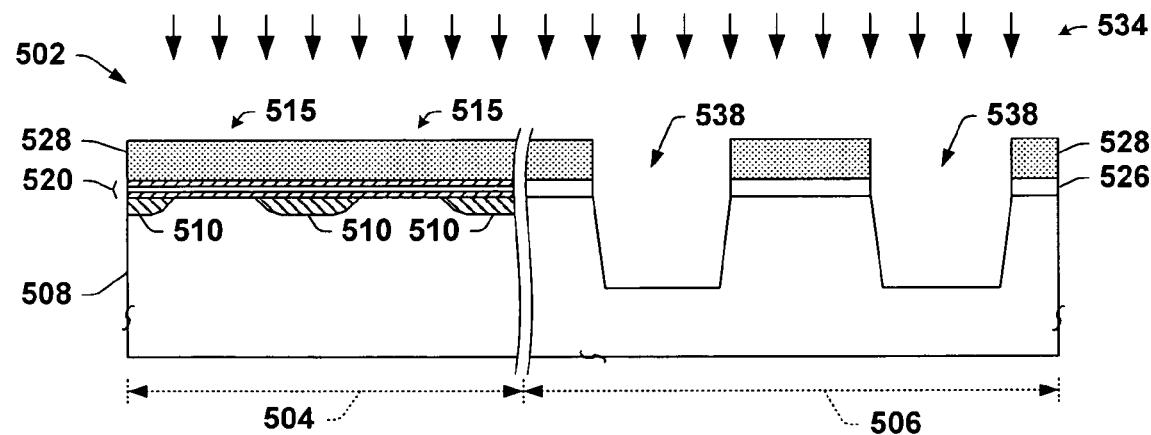
FIG. 18 is a partial side elevation view in section illustrating formation of an isolation trench in the substrate, through the first polysilicon layer and the gate dielectric layer in the periphery region in the wafer of FIG. 17.

In FIG. 18, isolation trenches are then formed in the periphery region 506 (etch mask not shown) of wafer 502, as in method steps 316 or 366, for example, by an etch process 534. Etching 534, proceeds into the substrate 508, through the first polysilicon layer 528 and the gate dielectric layer 526 in the periphery region 506, thereby defining shallow isolation trenches (STIs) 538 in the wafer 502 of FIG. 17. Any appropriate process steps and materials may be employed in patterning and etching the first polysilicon layer 528, and the gate dielectric layer 526, including dry etch chemistries as are known.

Figure 19:
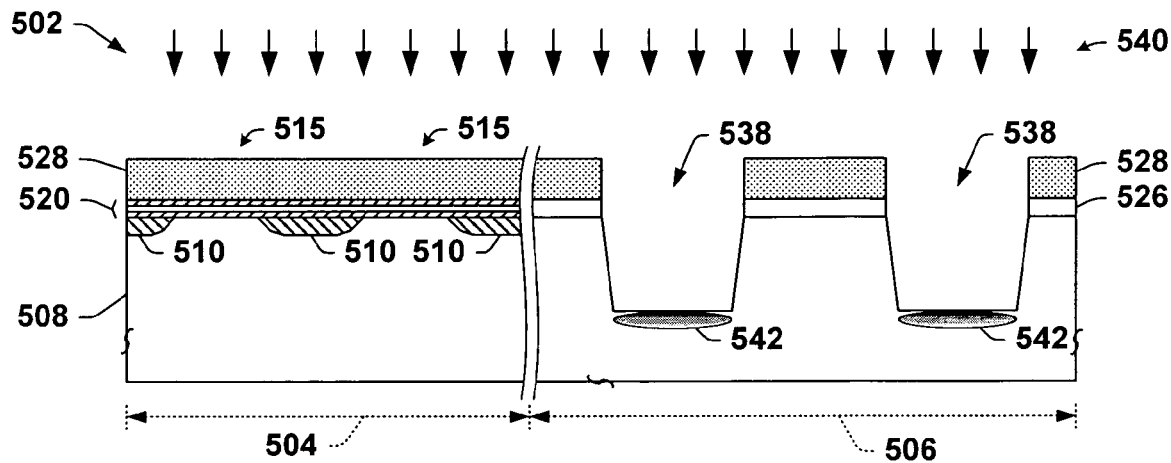
FIG. 19 is a partial side elevation view in section illustrating an isolation implantation of a dopant ion species into the substrate associated with the isolation trenches in the wafer of FIG. 18.

In FIG. 19, a dopant, such as B, $BF_2$, or another p-type ion species is then implanted, as in method step 370, for example, using a SASTI isolation implantation process 540 into the substrate 508 through the associated isolation trenches 538, forming a SASTI isolation implant 542 in the wafer 502 of FIG. 18. In accordance with the methods of the present invention, the SASTI isolation region 542, diffuses laterally less than prior art isolation implant regions because fewer thermal process steps (e.g., fewer oxidation and annealing thermal processes) are utilized herein after the formation thereof because the ONO and gate oxide are already formed. The reduced number of subsequent thermal processes results in less dopant diffusion (or maintained dopant concentration) of the SASTI isolation implant 542, thereby providing better electrical isolation of the isolation structure subsequently formed. Again, this effect will be discussed further in connection with the diffusion illustrated in prior art FIG. 6 compared to that of FIGS. 11, 19, and 24.

In FIG. 20, the isolation trenches 538 are filled, as in method steps 326 and 376, for example, by a deposition process 544 with a dielectric material (e.g., $SiO_2$) 546 in the wafer 502 of FIG. 19. The wafer is subsequently planarized (not shown) to define the dielectric material into SASTI isolation structures 546. Optionally, selected portions of the first polysilicon layer 528 and or other subsequent poly layers may then be patterned and etched (not shown) to form polysilicon gate structures in active regions 549 in the periphery region 506 of the wafer 502 between the SASTI isolation structures 546. Patterning may be accomplished using a photoresist, a nitride material layer, or other selective materials or structures. Thereafter, the patterning material or structures used for masking may then be removed from the wafer active regions 549, for example, using a wet or dry etching operation and the wafer 502 is cleaned, for example, with a rinse process.

Finally in FIG. 21, a second polysilicon layer 552 is formed, as in method steps 332 and 382, for example, by a deposition process 554 over the first polysilicon layer 528 and the SASTI isolation structures 546 in the wafer 502 of FIG. 20. Second polysilicon layer 552, for example, may be used together with the first polysilicon layer 528 to form polysilicon gate structures, to define conductive wordline structures, or to interconnect polysilicon gates to corresponding wordlines. The deposition of either the first or second polysilicon layer may be accomplished using chemical vapor deposition (CVD) processes or other such process that are known, followed by a patterning thereof. Thereafter, the exemplary implementation of the methods of the present invention ends, after which further process steps (not shown) may be performed to fabricate other structures and devices of the wafer, followed by metallization and other back end processing.

FIG. 22 illustrates at least a portion of the core region 504 of the SONOS flash memory device 502 (wafer) such as may be fabricated in accordance with one aspect of the invention of the method of FIGS. 7A, 7B, and 16-21. SONOS flash memory device 502 comprises a single or multi-bit virtual ground array of transistors 558, having associated gates connected along a row of wordlines (e.g., $WL_0$, $WL_1$, $WL_2$, $WL_3$) 570, and series connected drain to source for selection by columns of bitlines (e.g., $BL_0$, $BL_1$, $BL_2$, $BL_3$) 510 therebetween. Exemplary conductive (e.g., metal) vias or contacts 576 on the bitlines 510 and the wordlines 570, provide interconnection to address decoders or other such devices (not shown) as may be required in the periphery region 506 of memory device 502.

Thus, in accordance with the methods of the present invention, the SASTI isolation structures 546 define and isolate active regions 550 in the periphery region 506, and in the case of the single or multi-bit virtual ground array memory device 502, no isolation structure 546 are needed in the core region, since the bitlines 510 define the channel regions 515 therebetween. Further, the bitlines 510 comprise source/drain regions of the transistors 558, further comprising the ONO layer 520 for charge retention of each bit of the array.

Advantageously, the method of the present invention, avoids the conventional fabrication problems of residual ONO stringers, which affect production yield due to particles of the ONO residual dislodging during processing, allowing easier manufacturing. In addition, because the SASTI isolation implant region undergoes fewer thermal processes, subsequent dopant diffusion is minimized to provide better electrical isolation with the SASTI isolation structures 546 and less active loss in the periphery 506. Thus, the SASTI trench 538 makes possible self-alignment of the SASTI implant 540, when utilized, providing improved shallow trench electrical isolation.

FIG. 23 further illustrates a portion of an exemplary row 578 of the transistors 558 of the flash memory device 502 of FIG. 22, with the gates of the transistors 558 connected along an exemplary wordline (e.g., $WL_3$) 570.

Figure 24:
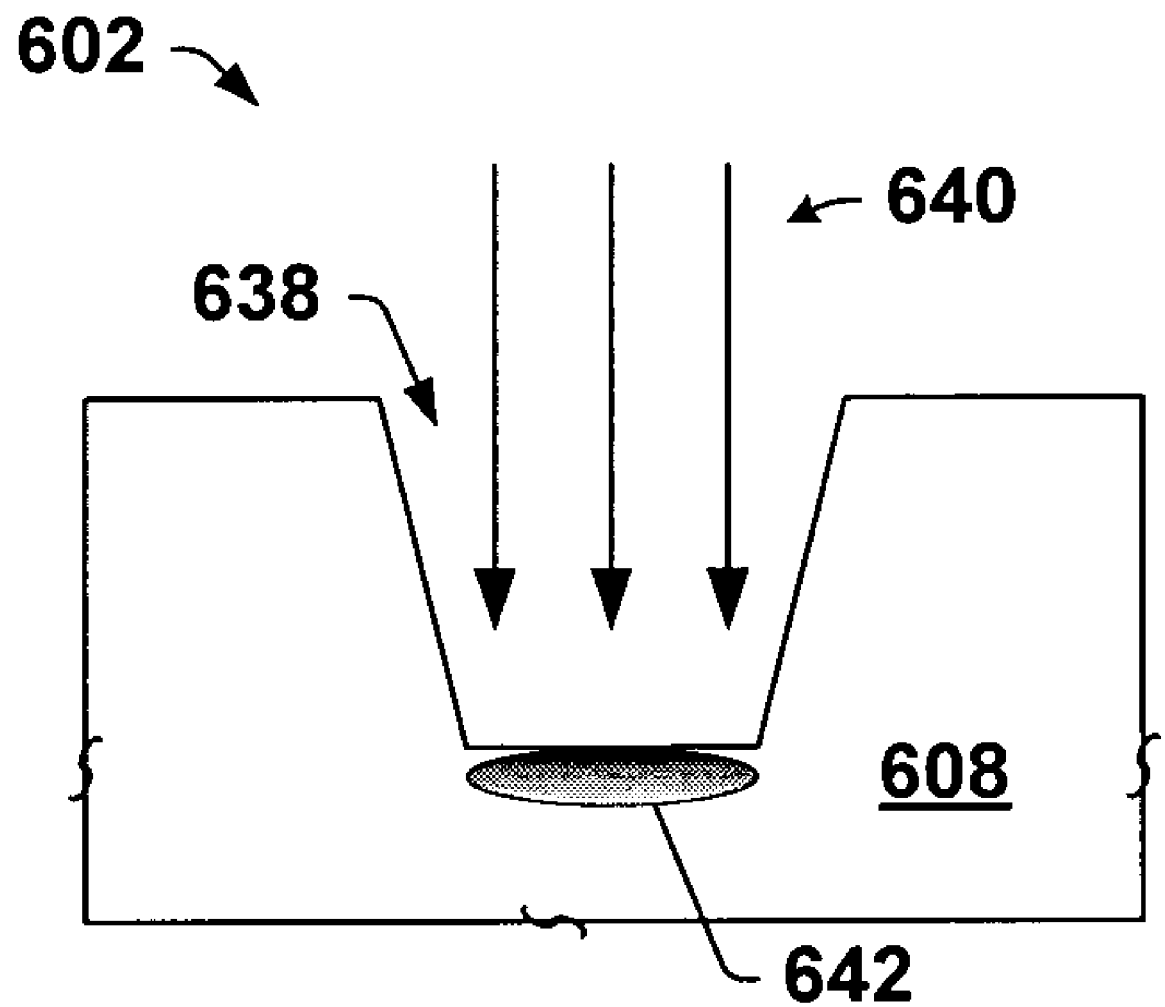
FIG. 24 is a partial side elevation view in section illustrating the improved effect of controlled dopant diffusion that may occur within the substrate below an STI trench after implantation performed in accordance with the fabrication method of FIGS. 7A, 7B, and 8-23.

FIG. 24 illustrates the improved effect of controlled dopant diffusion as compared to the conventional isolation implant and method of prior art FIG. 6 discussed previously.

In FIG. 24, another exemplary memory device or wafer 602 having a substrate 608 and a trench 638 formed therein, is illustrated in accordance with the method of the present invention of FIGS. 7A, 7B, as well as FIGS. 11 and 19. An isolation implant 640 of a dopant ion species (e.g., B, $BF_2$, or a p-type dopant) thru the trench opening 638 of FIG. 24, may be more self-aligned to the walls of the trench than the conventional implant 260 of FIG. 6, due to a reduction in the number of thermal processes. Thus, a self-aligned isolation region 642 is made possible by the method of the present invention.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating shallow isolation trench structures in a wafer, comprising:
    forming a multi-layer dielectric-charge trapping-dielectric stack over a substrate of the wafer;
    removing the multi-layer dielectric-charge trapping-dielectric stack in a periphery region of the wafer, thereby defining a multi-layer dielectric-charge trapping-dielectric stack in a core region of the wafer;
    forming a gate dielectric layer over the periphery region of the substrate;
    forming a first polysilicon layer over the multi-layer dielectric-charge trapping-dielectric stack in the core region and the gate dielectric in the periphery region;
    concurrently forming an isolation trench in the substrate, through the first polysilicon layer and the multi-layer dielectric-charge trapping-dielectric stack in the core region and through the first polysilicon layer and the gate dielectric layer in the periphery region, thereby defining isolation trenches;
    filling the isolation trenches with a dielectric material; and
    forming a second polysilicon layer over the first polysilicon layer and the filled trenches.

2. The method of claim 1, further comprising implanting a dopant ion species into the substrate associated with the isolation trenches after concurrently forming the isolation trenches in the core region and in the periphery region, and before filling the isolation trenches with a dielectric material.

3. The method of claim 2, wherein the dopant ion species implanted into the substrate associated with the isolation trenches is one of a B, a $BF_2$, and a p-type dopant ion species.

4. The method of claim 1, further comprising planarizing the wafer to separate individual isolation structures after filling the isolation trenches with a dielectric material and before forming a second polysilicon layer over the first polysilicon layer and the filled trenches.

5. The method of claim 4, wherein the planarizing the wafer to separate individual isolation structures is accomplished using a chemical mechanical polishing process.

6. The method of claim 1, wherein the forming a multi-layer dielectric-charge trapping-dielectric stack over the substrate of the wafer comprises forming a first oxide layer overlying the substrate of the wafer, a nitride layer overlying the first oxide layer, and a second oxide layer overlying the nitride layer.

7. The method of claim 1, wherein the shallow isolation trenches are fabricated in a multi-bit SONOS flash memory.

8. A method of fabricating shallow isolation trench structures in a wafer, comprising:
    forming a multi-layer dielectric-charge trapping-dielectric stack over a substrate of the wafer;
    removing the multi-layer dielectric-charge trapping-dielectric stack in a periphery region of the wafer, thereby defining a multi-layer dielectric-charge trapping-dielectric stack in a core region of the wafer;
    forming a gate dielectric layer over the periphery region of the substrate;
    forming a first polysilicon layer over the multi-layer dielectric-charge trapping-dielectric stack in the core region and the gate dielectric in the periphery region;
    forming isolation trenches in the substrate, through the first polysilicon layer and the gate dielectric layer in the periphery region, thereby defining isolation trenches;
    filling the isolation trenches with a dielectric material; and
    forming a second polysilicon layer over the first polysilicon layer and the filled trenches.

9. The method of claim 8, further comprising implanting a dopant ion species into the substrate associated with the isolation trenches after concurrently forming the isolation trenches in the core region and in the periphery region, and before filling the isolation trenches with a dielectric material.

10. The method of claim 9, wherein the dopant ion species implanted into the substrate associated with the isolation trenches is one of a B, a $BF_2$, and a p-type dopant ion species.

11. The method of claim 8, further comprising planarizing the wafer to separate individual isolation structures after filling the isolation trenches with a dielectric material and before forming a second polysilicon layer over the first polysilicon layer and the filled trenches.

12. The method of claim 11, wherein the planarizing the wafer to separate individual isolation structures is accomplished using a chemical mechanical polishing process.

13. The method of claim 8, wherein the forming a multi-layer dielectric-charge trapping-dielectric stack over the substrate of the wafer comprises forming a first oxide layer overlying the substrate of the wafer, a nitride layer overlying the first oxide layer, and a second oxide layer overlying the nitride layer.

14. The method of claim 8, wherein the shallow isolation trenches are fabricated in a multi-bit SONOS flash memory.

15. A method of fabricating a multi-bit SONOS flash memory cell, comprising:
    forming a multi-layer dielectric-charge trapping-dielectric stack over a substrate of a wafer;
    forming a first polysilicon layer over the multi-layer dielectric-charge trapping-dielectric stack;

concurrently forming isolation trenches in the substrate, through the first polysilicon layer and the multi-layer dielectric-charge trapping-dielectric stack, in a core region and in a periphery region, thereby defining isolation trenches;

filling the isolation trenches with a dielectric material; and forming a second polysilicon layer over the first polysilicon layer and the filled trenches.

16. The method of claim 15, further comprising implanting a dopant ion species into the substrate associated with the isolation trenches after concurrently forming the isolation trenches in the core region and in the periphery region, and before filling the isolation trenches with a dielectric material.

17. The method of claim 16, wherein the dopant ion species implanted into the substrate associated with the isolation trenches is one of a B, a $BF_2$, and a p-type dopant ion species.

18. The method of claim 15, further comprising planarizing the wafer to separate individual isolation structures after filling the isolation trenches with a dielectric material and before forming a second polysilicon layer over the first polysilicon layer and the filled trenches.

19. The method of claim 18, wherein the planarizing the wafer to separate individual isolation structures is accomplished using a chemical mechanical polishing process.

20. The method of claim 15, wherein the forming a multi-layer dielectric-charge trapping-dielectric stack over the substrate of the wafer comprises forming a first oxide layer overlying the substrate of the wafer, a nitride layer overlying the first oxide layer, and a second oxide layer overlying the nitride layer.

21. A method of fabricating a multi-bit SONOS flash memory cell, comprising:

forming a multi-layer dielectric-charge trapping-dielectric stack over a substrate of a wafer;

removing the multi-layer dielectric-charge trapping-dielectric stack in a periphery region of the wafer, thereby defining a multi-layer dielectric-charge trapping-dielectric stack in a core region of the wafer;

forming a first polysilicon layer over the multi-layer dielectric-charge trapping-dielectric stack;

forming isolation trenches in the substrate, through the first polysilicon layer and the multi-layer dielectric-charge trapping-dielectric stack, thereby defining isolation trenches;

filling the isolation trenches with a dielectric material; and forming a second polysilicon layer over the first polysilicon layer and the filled trenches.

* * * * *